(12) United States Patent
Tsuruta et al.

(10) Patent No.: US 8,183,544 B2
(45) Date of Patent: May 22, 2012

(54) CORRECTING SUBSTRATE FOR CHARGED PARTICLE BEAM LITHOGRAPHY APPARATUS

(75) Inventors: Kaoru Tsuruta, Kanagawa (JP); Takashi Kamikubo, Tokyo (JP); Rieko Nishimura, Kanagawa (JP); Shusuke Yoshitake, Kanagawa (JP); Shuichi Tamamushi, Kanagawa (JP)

(73) Assignee: NuFlare Technology, Inc., Numazu-shi (JP)

( * ) Notice: Subject to any disclaimer, the term of this patent is extended or adjusted under 35 U.S.C. 154(b) by 469 days.

(21) Appl. No.: 12/408,212

(22) Filed: Mar. 20, 2009

(65) Prior Publication Data

US 2009/0242807 A1   Oct. 1, 2009

(30) Foreign Application Priority Data

Mar. 21, 2008   (JP) ................................. 2008-073538

(51) Int. Cl.
*A61N 5/00* (2006.01)
(52) U.S. Cl. ............... 250/492.22; 250/370.09; 430/5; 430/30; 355/52; 355/53
(58) Field of Classification Search ............ 250/492.22, 250/370.09; 430/5, 30; 355/52, 53
See application file for complete search history.

(56) References Cited

U.S. PATENT DOCUMENTS

| | | | | |
|---|---|---|---|---|
| 5,656,397 A * | 8/1997 | Imai et al. | ........................ | 430/5 |
| 5,885,735 A * | 3/1999 | Imai et al. | ........................ | 430/5 |
| 6,051,347 A * | 4/2000 | Tzu et al. | ........................ | 430/30 |
| 6,194,103 B1 * | 2/2001 | Tzu et al. | ........................ | 430/5 |
| 6,204,506 B1 * | 3/2001 | Akahori et al. | .......... | 250/370.09 |
| 6,596,444 B2 * | 7/2003 | Buck | ................................ | 430/5 |
| 6,632,722 B2 | 10/2003 | Fujiwara et al. | | |
| 7,169,513 B2 * | 1/2007 | Shiota et al. | ........................ | 430/5 |
| 7,511,290 B2 * | 3/2009 | Suzuki et al. | ............. | 250/492.22 |
| 7,592,106 B2 * | 9/2009 | Shiota et al. | ........................ | 430/5 |
| 2001/0052573 A1 | 12/2001 | Takakuwa | | |
| 2006/0199082 A1 * | 9/2006 | Flanigan et al. | ..................... | 430/5 |
| 2007/0103657 A1 * | 5/2007 | Yoshitake et al. | ............... | 355/52 |
| 2007/0103659 A1 * | 5/2007 | Yoshitake et al. | ............... | 355/53 |
| 2007/0172647 A1 * | 7/2007 | Kleideiter et al. | ............. | 428/336 |
| 2008/0279079 A1 * | 11/2008 | Hosoda et al. | .................. | 369/94 |
| 2011/0089346 A1 * | 4/2011 | Tsuruta | ..................... | 250/492.22 |

FOREIGN PATENT DOCUMENTS

| | | |
|---|---|---|
| JP | 2007-294562 | 11/2007 |
| JP | 2007-328038 | 12/2007 |
| KR | 2001-0113475 | 12/2001 |

OTHER PUBLICATIONS

Terrence E. Zavecz, "A Comprehensive Test Sequence for the Electron Beam Exposure System", Solid State Technology, Feb. 1982, pp. 106-110.
Korean Office Action issued on Jan. 6, 2011, in the corresponding Korean Patent Application No. 10-2009-0023723.

* cited by examiner

*Primary Examiner* — Nikita Wells
*Assistant Examiner* — Johnnie L Smith
(74) *Attorney, Agent, or Firm* — Oblon, Spivak, McClelland, Maier & Neustadt, L.L.P.

(57) ABSTRACT

A correcting substrate for a charged particle beam lithography apparatus includes a substrate body using a low thermal expansion material having a thermal expansion lower than that of a silicon oxide ($SiO_2$) material; a first conductive film arranged above the substrate; and a second conductive film selectively arranged on the first conductive film and having a reflectance higher than the first conductive film, wherein the low thermal expansion material is exposed on a rear surface of the correcting substrate.

8 Claims, 10 Drawing Sheets

— Design Coordinate Grid
● Coordinate Measurement Value
  $(X_{ij} + \Delta X_{ij}, Y_{ij} + \Delta Y_{ij})$

FIG. 4A

Bivariate Polynomial Fitting

— Design Coordinate Grid
— Position Error Fitting Grid

FIG. 4B

Present Fitting
Fitting Coefficient
$A_0 \sim A_9$, $B_0 \sim B_9$

FIG. 5A

Difference Between Present Coefficient And Previous Coefficient

Previous Fitting
Fitting Coefficient
$A_0' \sim A_9'$, $B_0' \sim B_9'$

Fluctuation Of Each Fitting Coefficient
$dA_0 = A_0 - A_0'$ · $dB_0 = B_0 - B_0'$
... ... ...      ... ... ...
$dA_9 = A_9 - A_9'$ · $dB_9 = B_9 - B_9'$

CORRECTING SUBSTRATE FOR CHARGED PARTICLE BEAM LITHOGRAPHY APPARATUS

CROSS-REFERENCE TO RELATED APPLICATION

This application is based upon and claims the benefit of priority from prior Japanese Patent Application No. 2008-073538 filed on Mar. 21, 2008 in Japan, the entire contents of which are incorporated herein by reference.

BACKGROUND OF THE INVENTION

1. Field of the Invention

The present invention relates to a correcting substrate for a charged particle beam lithography apparatus for example, a correcting substrate which corrects a stage position of a lithography apparatus which writes a pattern on a target object by using an electron beam.

2. Related Art

A lithography technique which leads development of micropatterning of a semiconductor device is a very important process which generates a pattern in semiconductor manufacturing processes. In recent years, with an increase in integration density of an LSI, a circuit line width required for a semiconductor device is further miniaturized each year. In order to form a desired circuit pattern on such a semiconductor device, a high-precision original pattern (also called a reticle or a mask) is necessary. In this case, an electron beam pattern writing technique essentially has an excellent resolution, and is used in production of high-precision original patterns.

Figure 12:
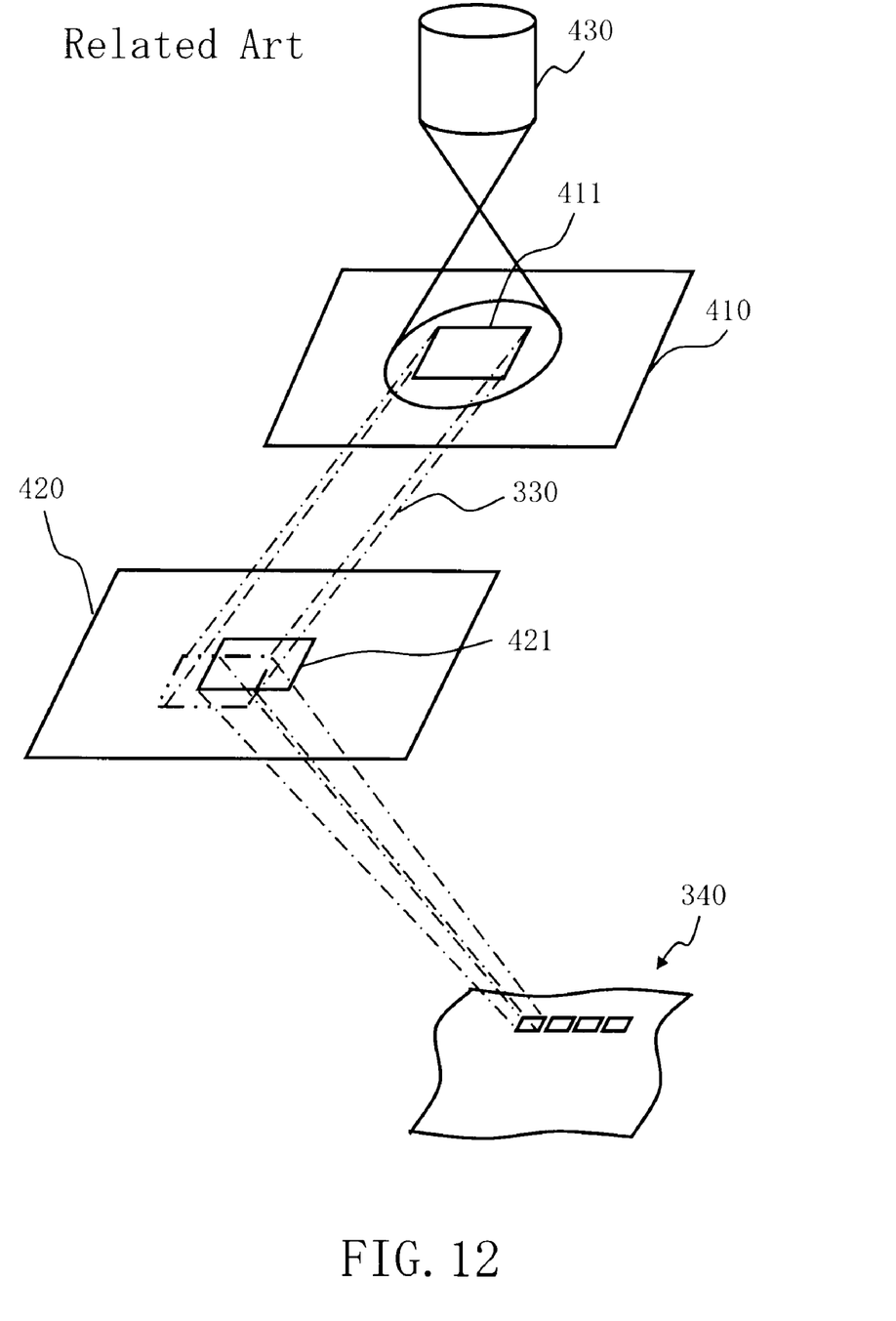
FIG. 12 is a conceptual diagram for explaining an operation of a conventional variable-shaped electron beam lithography apparatus.

FIG. 12 is a conceptual diagram for explaining an operation of a conventional variable-shaped electron beam lithography apparatus.

The operation of the variable-shaped electron beam (EB: Electron Beam) lithography apparatus will be described below. In a first aperture plate 410, an oblong, for example, rectangular opening 411 to shape an electron beam 330 is formed. In a second aperture plate 420, a variable-shaped opening 421 to shape the electron beam 330 passing through the opening 411 of the first aperture plate 410 into a desired oblong shape is formed. The electron beam 330 irradiated from the charged particle source 430 and passing through the opening 411 of the first aperture plate 410 is deflected by a deflector, passes through a part of the variable-shaped opening 421 of the second aperture plate 420, and is irradiated on a target object 340 placed on a stage continuously moving in one predetermined direction (for example, direction X). More specifically, an oblong shape which can pass through both the opening 411 of the first aperture plate 410 and the variable-shaped opening 421 of the second aperture plate 420 is written in a pattern writing region on the target object 340 placed on the stage continuously moving in the direction X. The scheme that causes a beam to pass through the opening 411 of the first aperture plate 410 and the variable-shaped opening 421 of the second aperture plate 420 to form an arbitrary shape is called a variable-shaping scheme (for example, see Published Unexamined Japanese Patent Application No. 2007-294562).

In this case, in the electron beam lithography apparatus, the position of a stage on which a target object such as a mask substrate is placed is measured by a length measuring device using, for example, a laser interferometer to determine a beam irradiation position. At this time, a mirror which reflects the laser is arranged on the stage. With passage of time, distortion or the like of the mirror may change, and an error may occur at a global pattern writing position. For this reason, in the electron beam lithography apparatus, a process of correcting a position error caused by mirror distortion or the like is performed by using a correcting substrate on which patterns are regularly arranged. The following substrate is used as a conventional correcting substrate. That is, a metal film is deposited on a glass substrate including silicon oxide ($SiO_2$) and the metal film is completely removed according to a pattern portion for global position error correction. For this reason, a glass surface is exposed on the pattern portion from which the metal film is removed. An electron beam is irradiated on the correcting substrate, and reflected electrons are detected so that a process of measuring a pattern position to correct an error is performed. However, when electron beam scanning is performed by using the correcting substrate, the exposed glass substrate is electrically charged. For this reason, an unexpected measurement error disadvantageously occurs.

As a correcting substrate, a substrate having the pattern portion from which a metal film is not completely removed and on which the metal film is slightly left is used. Electronic charging can be avoided when electron beam scanning is performed by using the correcting substrate formed to slightly leave the metal film thereon. However, since the pattern portion and the other portion include a metal having equal electron reflectances, contrast is determined by only a step of the pattern. For this reason, a position resolution is not preferable, and accurate measurement cannot be easily performed.

Furthermore, in any one of the correcting substrates, the substrate itself thermally expands due to heat generation of the glass substrate by electron beam irradiation to cause an error.

As described above, problems such as electron charging and deterioration of contrast are posed. Furthermore, a position error caused by thermal expansion of the glass substrate is another problem. With micropatterning of recent patterns, a correcting substrate which solves the above problems to perform accurate position correction is required to be developed.

BRIEF SUMMARY OF THE INVENTION

It is an object of the present invention to provide a correcting substrate and a pattern writing method which can perform accurate position correction.

In accordance with one aspect of this invention, a correcting substrate for a charged particle beam lithography apparatus includes a substrate body using a low thermal expansion material having a thermal expansion lower than that of a silicon oxide ($SiO_2$) material; a first conductive film arranged above the substrate; and a second conductive film selectively arranged on the first conductive film and having a reflectance higher than the first conductive film, wherein the low thermal expansion material is exposed on a rear surface of the correcting substrate.

In accordance with another aspect of the invention, a pattern writing method includes scanning a correcting substrate on which two films having different reflectances are formed by using a charge particle beam to detect reflected electrons reflected from the correcting substrate; correcting an error of an irradiation position of the charged particle beam by using a detected result; and writing a pattern on a target object by using the charged particle beam whose the irradiation position is corrected.

DETAILED DESCRIPTION OF THE INVENTION

In an embodiment, as an example of a charged particle beam, a configuration using an electron beam will be described below. The charged particle beam is not limited to an electron beam. A charged particle beam such as an ion beam using other charged particles may be used.

Embodiment 1

Figure 1:
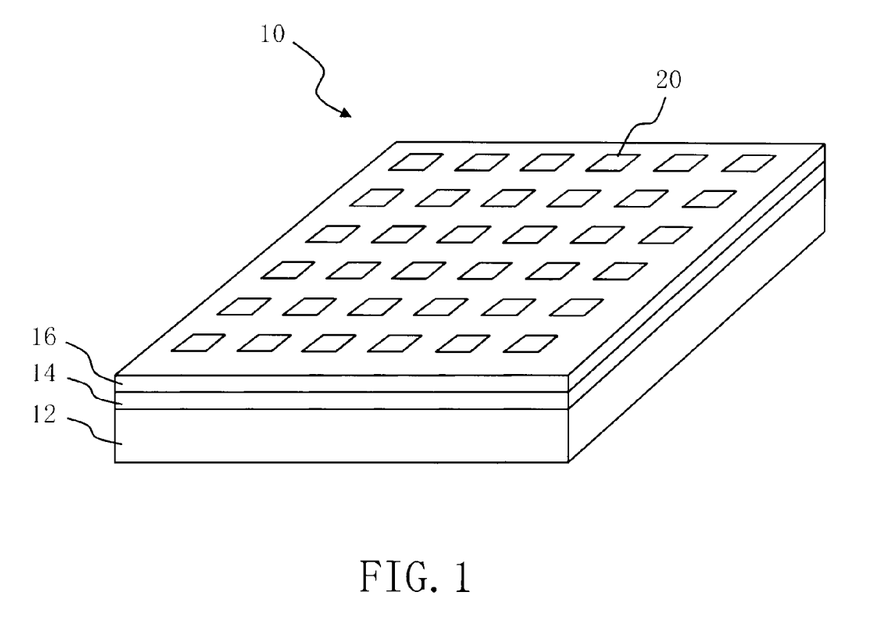
FIG. 1 is a conceptual diagram showing a configuration of a correcting substrate for an electron beam lithography apparatus according to Embodiment 1.
Figure 2:
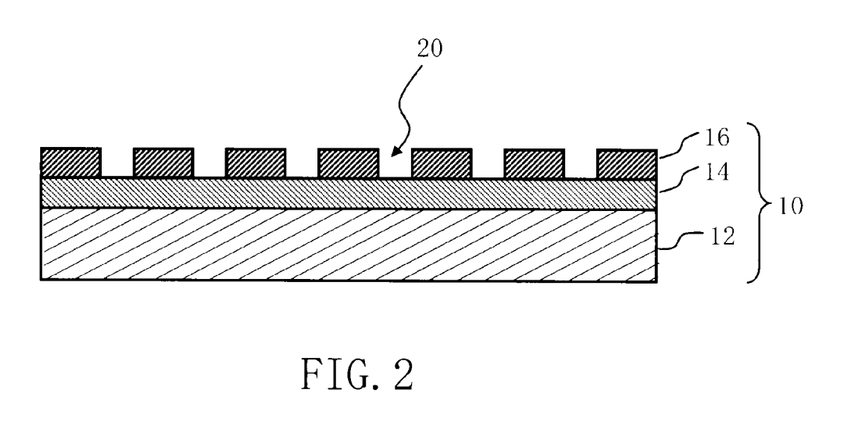
FIG. 2 is a conceptual diagram showing a section of the correcting substrate of the electron beam lithography apparatus in FIG. 1.

FIG. 1 is a conceptual diagram showing a configuration of a correcting substrate for an electron beam lithography apparatus according to Embodiment 1. FIG. 2 is a conceptual diagram showing a section of the correcting substrate of the electron beam lithography apparatus in FIG. 1. A correcting substrate 10 for the electron beam lithography apparatus includes a substrate body 12 and conductive films 14 and 16. The conductive film 14 (first conductive film) is arranged on the substrate body 12. The conductive film 16 (second conductive film) is selectively arranged on the conductive film 14. On the conductive film 16, a plurality of openings 20 which are regularly arranged and penetrate to the conductive film 14 are formed. The openings 20 are preferably almost uniformly arranged on the entire area of the conductive film 16 such that the openings 20 are evenly distributed. The openings 20 are patterned to measure positions so that a stage position of the electron beam lithography apparatus can be corrected. Since bottom surfaces of the openings 20 are the conductive film 14, electronic charging can be avoided by irradiating an electron beam. For this reason, an unexpected error caused by electronic charging does not occur. For example, a grounded pin is brought from the upper surface of the correcting substrate 10 into contact with the conductive film 14 or the conductive film 16 so that the correcting substrate 10 and the grounding member are connected to each other.

The conductive film 16 preferably consists of a material having a reflectance higher than that of the conductive film 14. As the material of the conductive film 16, for example, an atom having an atomic number of 73 or more are preferably used. When an atom having an atomic number of 73 or more is used, the reflectance of an electron beam can be made higher than that of the conductive film 14. As the material of the conductive film 16, a material having a melting point almost equal to that of the substrate body 12 is preferably used. When the material having a high melting point is used, the conductive film can be prevented from melting when an electron beam is irradiated. For example, a material having a melting point of 1000° C. or more is preferably used. As the material of the conductive film 16, a material which is harder than that of the conductive film 14 and is not easily corroded is preferably used. As described above, the correcting substrate is used many times, and the surface of the substrate is subjected to chemical washing. For this reason, a hard material which is not easily corroded is used to make it possible to suppress abrasion and deformation of the film. As materials which satisfy these conditions, for example, tantalum (Ta), tungsten (W), platinum (Pt), and compounds thereof can be used.

As the conductive film 14, a material having a reflectance of an electron beam lower than that of the conductive film 16 is preferably used. As the material of the conductive film 14, for example, an atom having an atomic number of smaller than 73 is preferably used. When the atom having the atomic number of smaller than 73 is used, a reflectance of an electron beam can be made lower than that of the conductive film 16. As the material of the conductive film 14, a material having a melting point almost equal to that of the substrate body 12 is preferably used. When the material having a high melting point is used, the conductive film can be prevented from being melted when an electron beam is irradiated. For example, a material having a melting point of 1000° C. or more is preferably used. As the material of the conductive film 14, a material which is harder than that of the conductive film 16 and is not easily corroded is preferably used. The correcting substrate is used many times, and the surface of the substrate is subjected to chemical washing. For this reason, a hard material which is not easily corroded is used to make it possible to suppress abrasion and deformation of the film. As materials which satisfy these conditions, for example, chromium (Cr), titanium (Ti), vanadium (V), and compounds thereof can be used.

The materials of the conductive films 14 and 16 are not limited to the metal-containing materials. As the conductive films 14 and 16, conductive films having different reflectances may be used.

As described above, the conductive films 14 and 16 having different reflectances are arranged on outer surfaces of the openings 20 and bottoms surfaces of the openings 20 to make it possible to increase contrasts of signals detected in electron beam scanning. Therefore, the position of a pattern can be accurately measured.

As the substrate body 12, a low thermal expansion material having a thermal expansion lower than that of a silicon oxide ($SiO_2$) material is preferably used. As a conventional correcting substrate, a glass substrate including $SiO_2$ material is used. The glass substrate has a thermal expansion coefficient of about 1 ppm/° C. When electron beam scanning (will be described later) is performed, the substrate itself thermally expands due to heat generation caused by electron beam irradiation, and an error also occurs due to the thermal expansion. In contrast to this, as the substrate body 12 in Embodiment 1, a material having a thermal expansion lower than that of a silicon oxide ($SiO_2$) material is used. For example, Ti may be doped in an $SiO_2$ material to form a low-thermal-expansion substrate. In this manner, the thermal expansion coefficient of the substrate body 12 can be suppressed to, for example, 0±30 ppb/° C. When the material having a lower thermal expansion coefficient is used as described above, a position error caused by thermal expansion when electron beam scanning is performed can be suppressed.

In this case, the rear surface of the correcting substrate 10 is, for example, a conductive material film and exposes a low thermal expansion material itself serving as the material of the substrate body 12 without being coated. In actual pattern writing, a target object such as a mask substrate on which a pattern is to be written is supported by three-point support in the lithography apparatus. In this manner, the target object is placed on three pin-like support members. Therefore, when a pattern is written on the target object by the lithography apparatus, the target object may be slipped and displaced by movement of the stage on which the target object is placed. The slipping may cause the target object to be displaced. Since the rear surface of the target object is the glass substrate itself, which is not coated with another material, the correcting substrate 10 preferably has the same conditions as those of a target object used in actual pattern writing to as much as possible. Therefore, in embodiment 1, the rear surface of the correcting substrate 10 is not coated with another material to expose a low thermal expansion material itself, which is the material of the substrate body 12 so that displacement caused by slipping of the target object can be simultaneously observed.

As described above, according to Embodiment 1, a position error caused by thermal expansion of the correcting substrate 10 is suppressed, and electronic charge and deterioration of contrast can be avoided. As a result, accurate position correction can be performed by using the correcting substrate 10.

Figure 3:
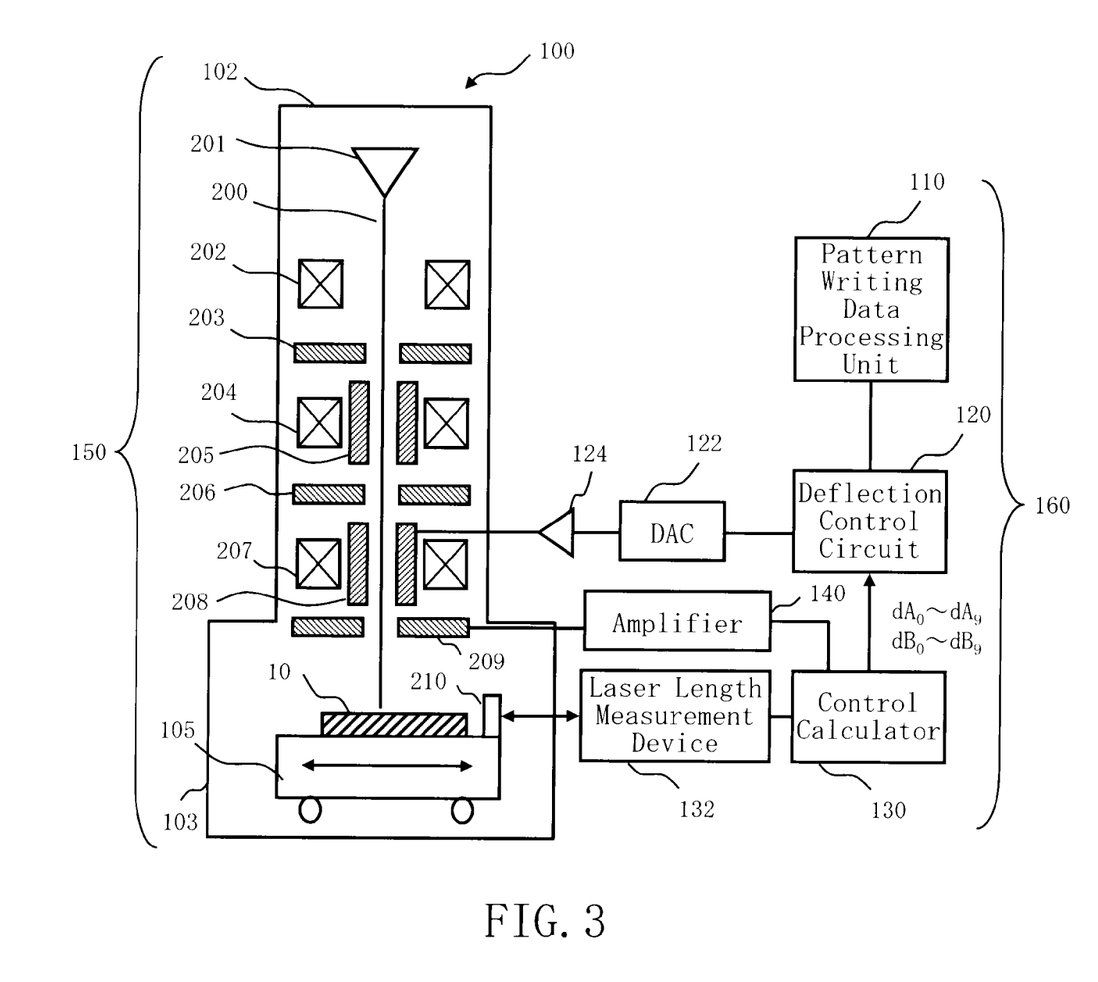
FIG. 3 is a conceptual diagram showing a configuration of the lithography apparatus according to Embodiment 1.

FIG. 3 is a conceptual diagram showing a configuration of the lithography apparatus according to Embodiment 1. In FIG. 3, the lithography apparatus 100 is an example of the charged particle beam lithography apparatus. The lithography apparatus 100 includes a pattern writing unit 150 and a control unit 160. The pattern writing unit 150 includes an electron lens barrel 102 arranged in a pattern writing chamber 103 and above the pattern writing chamber 103. In the electron lens barrel 102, there is an electron gun assembly 201, an illumination lens 202, a first aperture plate 203, a projection lens 204, a deflector 205, a second aperture plate 206, an objective lens 207, a deflector 208, and a detector 209. In the pattern writing chamber 103, an X-Y stage 105 is arranged. On the X-Y stage 105, a mirror 210 for laser length measurement is arranged. On the X-Y stage 105, a correcting substrate 10 is placed. A pattern writing target substrate includes, for example, a wafer on which semiconductor devices are formed and an exposure mask which transfers a pattern to a wafer. The mask includes, for example, mask blanks on which any pattern is not formed. The main computer 160 has a writing data processing unit 110, a deflection control circuit 120, a digital/analog converter (DAC) 122, an amplifier 124, a control calculator 130, a laser length measurement device 132, and an amplifier 140 for the detector 209. In FIG. 3, a configuration required to explain Embodiment 1 is merely described. However, another configuration may be arranged as a matter of course.

When a pattern is written on a pattern writing target substrate, pattern writing data input by the writing data processing unit 110 is converted in a multi-stage manner to create shot data. The shot data is output to the deflection control circuit 120. A digital signal to deflect the deflector 208 to a desired position is output from the deflection control circuit 120. The digital signal is converted into an analog voltage by the DAC 122, amplified by the amplifier 124, and applied to the deflector 208.

When a pattern is written on a pattern writing target substrate, the pattern writing unit 150 operates as follows. An electron beam 200 emitted from the electron gun assembly 201 illuminates the entire area of the first aperture plate 203 having an oblong, for example, rectangular hole by the illumination lens 202. In this case, the electron beam 200 is first shaped into an oblong, for example, a rectangle first. The electron beam 200 of the first aperture image passing through the first aperture plate 203 is projected on the second aperture plate 206 by the projection lens 204. The position of the first aperture image on the second aperture plate 206 is deflected and controlled by the deflector 205 to make it possible to change the beam shape and size. The electron beam 200 of the second aperture image passing through the second aperture plate 206 is focused by the objective lens 207, deflected by the deflector 208 controlled by the deflection control circuit 120, and irradiated on a desired position of the pattern writing target substrate on the X-Y stage 105, which continuously moves. The position of the X-Y stage 105 can be measured such that a laser beam irradiated from the laser length measurement device 132 is reflected by the mirror 210 and the reflected beam is received by the laser length measurement device 132. In this manner, the lithography apparatus 100 writes a pattern on the pattern writing target substrate by using the electron beam 200. In order to correct the pattern writing position at high accuracy, positions of the openings 20 are measured by using the correcting substrate 10.

As described above, with the passage of time, in order to correct an error of a pattern writing position caused by distortion or the like of a mirror, positions of the openings 20 are measured by using the correcting substrate 10. A measuring method will be described below. When the correcting substrate 10 is placed on the X-Y stage 105, the electron beam 200 is irradiated from the electron gun assembly 201. In this case, the electron beam need not be shaped, and the first aperture plate 203 and the second aperture plate 206 may be arranged such that apertures are located at the center of an optical axis. An electron beam passing through the first aperture plate 203 and the second aperture plate 206 is deflected by the deflector 208 controlled by the deflection control circuit 120 to scan the correcting substrate 10. Reflected electrons reflected from the surface of the correcting substrate 10 are detected by the detector 209 and output to the control calculator 130 through the amplifier 140. When the openings over the deflection region of the deflector 208 are to be scanned, the position may be adjusted by moving the X-Y stage 105.

Figure 4A:
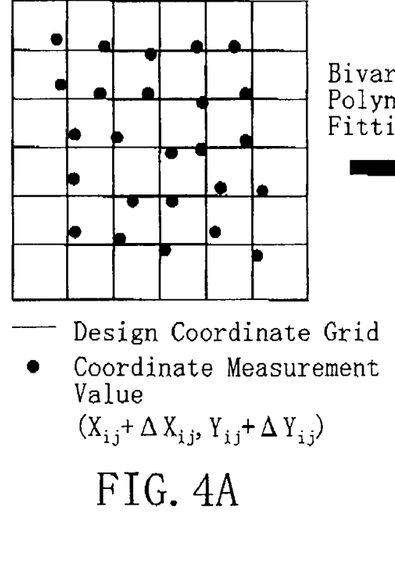
FIGS. 4A and 4B are diagrams for explaining a manner of position correction in Embodiment 1.
Figure 4B:
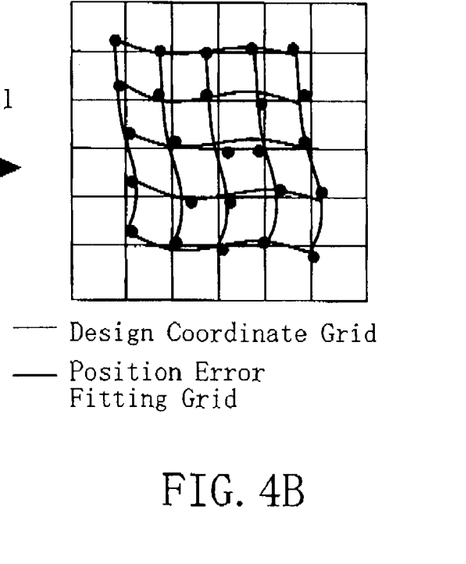

FIGS. 4A and 4B are diagrams for explaining a manner of position correction in Embodiment 1. In FIG. 4A shows a state in which a measurement point is arranged on the coordinate grid of a substrate. In Embodiment 1, since electrons reflected from the conductive films 14 and 16 having different reflectances are detected, high contrast can be obtained, and a position can be accurately measured. Since the conductive films 14 and 16 occupy the surface of the correcting substrate, a measurement error caused by electronic charging can also be avoided. Furthermore, since the low thermal expansion material is used, a measurement error caused by thermal expansion of the substrate body 12 can be neglected. Measurement points obtained as described above are approximated (fitting) by a polynomial expression so that a position error map can be obtained as shown in FIG. 4B. A position error $\Delta X_{ij}$ in an direction X and a position error $\Delta Y_{ij}$ in direction Y at each position of a substrate surface can be approximated by, for example, a bivariate cubic polynomial (1) and an equation (2) (will be described below)

$$\Delta X_{ij} = A_0 + A_1 \cdot X_{ij} + A_2 \cdot Y_{ij} + A_3 \cdot X_{ij}^2 + A_4 \cdot X_{ij} \cdot Y_{ij} + \\ A_5 \cdot Y_{ij}^2 + A_6 \cdot X_{ij}^3 + A_7 \cdot X_{ij}^2 \cdot Y_{ij} + A_7 \cdot X_{ij} \cdot Y_{ij}^2 + A_9 \cdot Y_{ij}^3 \quad (1)$$

$$\Delta X_{ij} = B_0 + B_1 \cdot X_{ij} + B_2 \cdot Y_{ij} + B_3 \cdot X_{ij}^2 + B_4 \cdot X_{ij} \cdot Y_{ij} + \\ B_5 \cdot Y_{ij}^2 + B_6 \cdot X_{ij}^3 + B_7 \cdot X_{ij}^2 \cdot Y_{ij} + B_7 \cdot X_{ij} \cdot Y_{ij}^2 + B_9 \cdot Y_{ij}^3 \quad (2)$$

The control calculator 130 sets coefficients $A_0$ to $A_9$ and $B_0$ to $B_9$ obtained by calculation in the deflection control circuit 120. When a pattern is written on a pattern writing target substrate, the deflection control circuit 120 controls the electron beam 200 such that the electron beam 200 is deflected to a position obtained by correcting the position error $\Delta X_{ij}$ in direction X and the position error $\Delta Y_{ij}$ in the direction Y calculated by equations (1) and (2) with respect to the coordinates of a pattern writing position. In this manner, a global position error caused by distortion or the like of the mirror 210 can be corrected. A manufacturing error of opening coordinates held by the openings 20 regularly arranged on the conductive film 16 is measured in advance, and contribution to the coefficients $A_0$ to $A_9$ and $B_0$ to $B_9$ is excluded as a matter of course.

However, since the error changes depend on passage of time, the pattern position must be periodically measured by using the correcting substrate 10 to calculate the coefficients to correct the error. For example, measurement is preferably performed once a week.

Figure 5A:
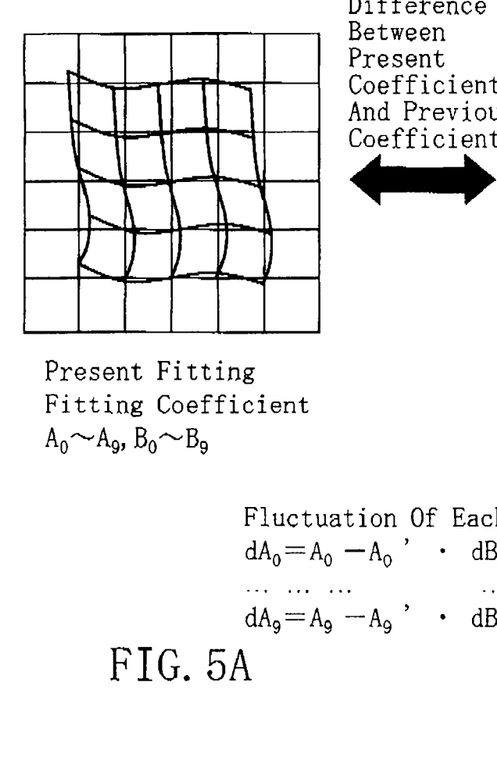
FIGS. 5A and 5B are diagrams showing an example of a change of a position error in Embodiment 1.
Figure 5B:
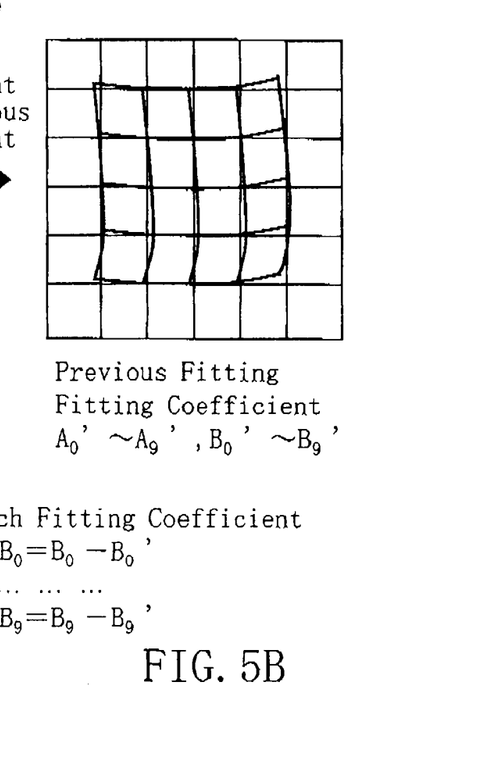

FIGS. 5A and 5B are diagrams showing an example of changes in position error in Embodiment 1. FIG. 5B shows an error map obtained in previous measurement performed by using the correcting substrate 10. On the other hand, FIG. 5A shows an error map obtained in the next measurement performed by using the correcting substrate 10. As shown in FIGS. 5A and 5B, the manner by which errors change with passage of time can be understood. The control calculator 130 calculates the differences between the present coefficients $A_0$ to $A_9$ and $B_0$ to $B_9$ obtained by the calculation and previously obtained coefficients $A'_0$ to $A'_9$ and $B'_0$ to $B'_9$. Calculated differences $dA_0$ to $dA_9$ and $dB_0$ to $dB_9$ are transmitted to the deflection control circuit 120. When a pattern is written on a pattern writing target substrate, the deflection control circuit 120 applies coefficients corrected by adding the differences $dA_0$ to $dA_9$ and $dB_0$ to $dB_9$ corresponding to the coefficients of equations (1) and (2) with respect to coordinates of a pattern writing position to equations (1) and (2). The electron beam 200 is controlled to be deflected to a position obtained by correcting the position error $\Delta X_{ij}$ in the direction X and the position error $\Delta Y_{ij}$ in the direction Y calculated by equations (1) and (2), the coefficients of which are corrected. In this manner, a global position error caused by distortion or the like of the mirror 210 changing with passage of time can be corrected. In this manner, when the "differences" between the previous coefficients and the current coefficients are calculated, systematic errors can be canceled if pattern positions on the manufactured correcting substrate 10 are not regularly arranged according to a design coordinate grid or if a difference such as support deflection caused by a difference between the type of the substrate body 12 and the type of the normal pattern writing target substrate exercises different influences on position errors of the patterns. Therefore, the correcting substrate 10 can be particularly preferable applied to correction for a change with passage of time.

In the explanation of the example described above, an error of a beam irradiation position caused after activation of the lithography apparatus 100 is corrected. However, the method of using the correcting substrate 10 is not limited to the above example. For example, the correcting substrate 10 can be used when distortion of pattern writing position accuracy is corrected in the activation of the lithography apparatus 100. A conventional correcting substrate has a small difference between reflectances and cannot obtain a sufficient contrast, and an error cannot be easily measured with high accuracy. For this reason, distortion in the activation of the lithography apparatus is measured as follows. That is, in general, test patterns are actually written by the lithography apparatus in a plurality of mask blanks, and positions of the obtained test patterns are measured by another measurer to determine the error of the beam irradiation position. The error of the beam irradiation position is corrected to correct an error obtained by averaging a plurality of results. For this reason, until position correction parameters are determined, a plurality of masks must be written, and the positions of the masks must be measured. As such, both a lot of time and high costs are necessary.

Figure 6A:
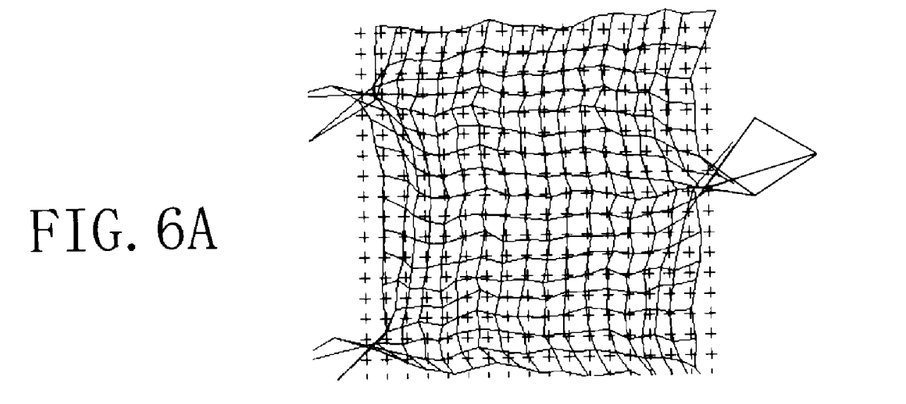
FIGS. 6A to 6C are diagrams showing examples of conditions of position errors of three test patterns.
Figure 6B:
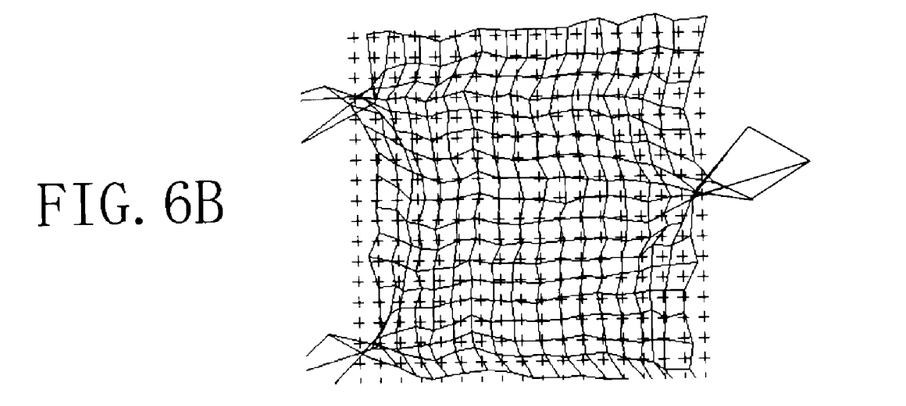
Figure 6C:
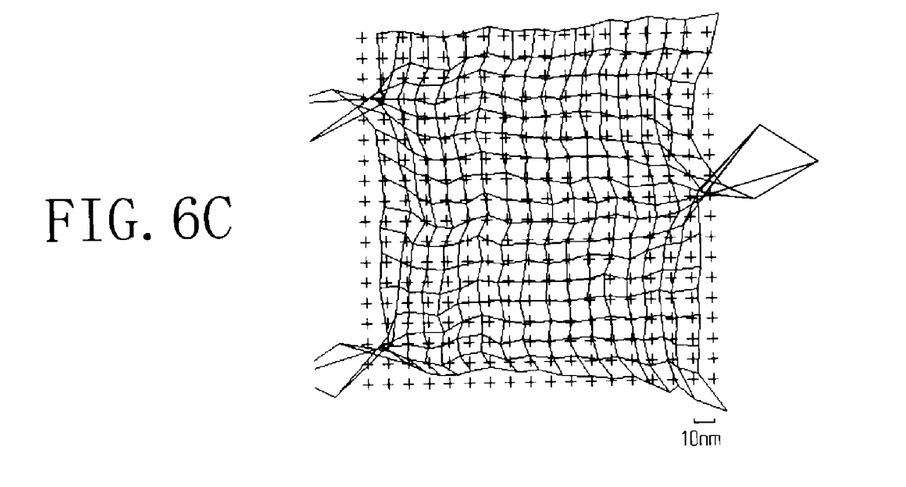
Figure 7A:
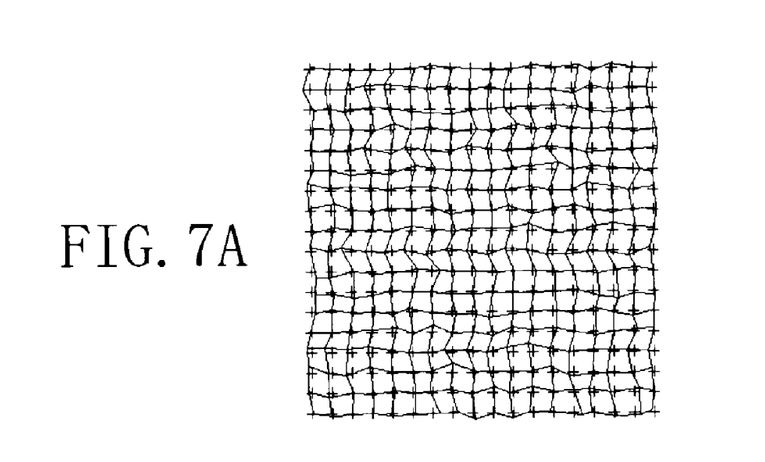
FIGS. 7A to 7C are diagrams showing maps obtained when two examples of the three examples shown in FIGS. 6A to 6C are differentiated from each other.
Figure 7B:
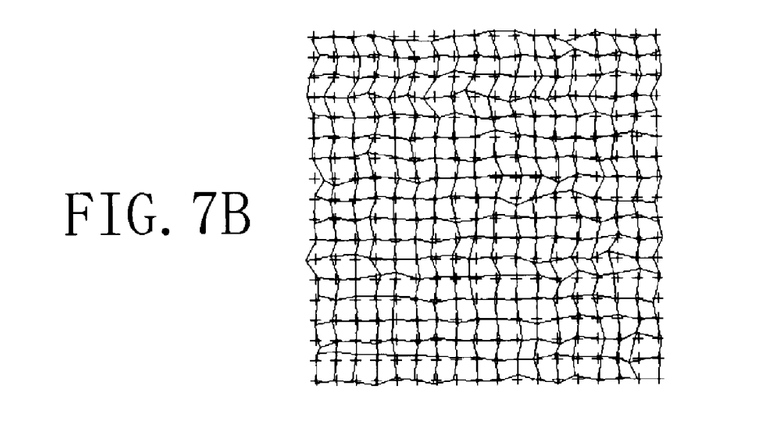
Figure 7C:
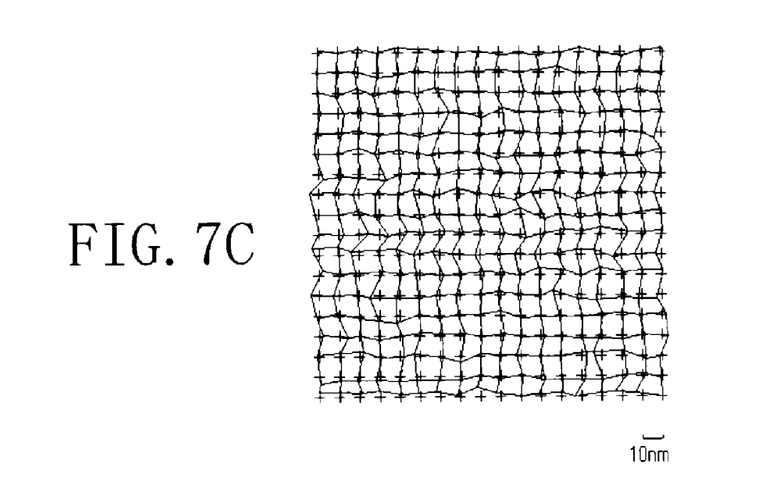

FIGS. 6A to 6C are diagrams showing examples of conditions of position errors of three test patterns. It is understood that there are three positions at which there is a local increase in error probability, even in each of the three test patterns shown in FIGS. 6A to 6C, for example, FIGS. 7A to 7C are diagrams showing maps obtained when two of the three examples shown in FIGS. 6A to 6C are differentiated from each other. FIG. 7A shows a map obtained by differentiating the error data shown in FIG. 6C from the error data shown in FIG. 6A. FIG. 7B shows a map obtained by differentiating the error data shown in FIG. 6A from the error data shown in FIG. 6B. FIG. 7C shows a map obtained by differentiating the error data shown in FIG. 6B from the error data shown in FIG. 6C. In each of the maps shown in FIGS. 7A to 7C, the large local error is reduced. Position correction in the lithography apparatus 100 is performed such that an amount of correction is set to reduce the large local error.

However, position data of test patterns obtained by actually writing test patterns by the lithography apparatus 100 as a plurality of mask blanks includes an uncertainty (fluctuation) of, for example, about 4 nm to 5 nm. For this reason, the average value of position data is calculated for, for example, three test patterns obtained to reduce the uncertainty of about 4 nm to 5 nm.

Figure 8:
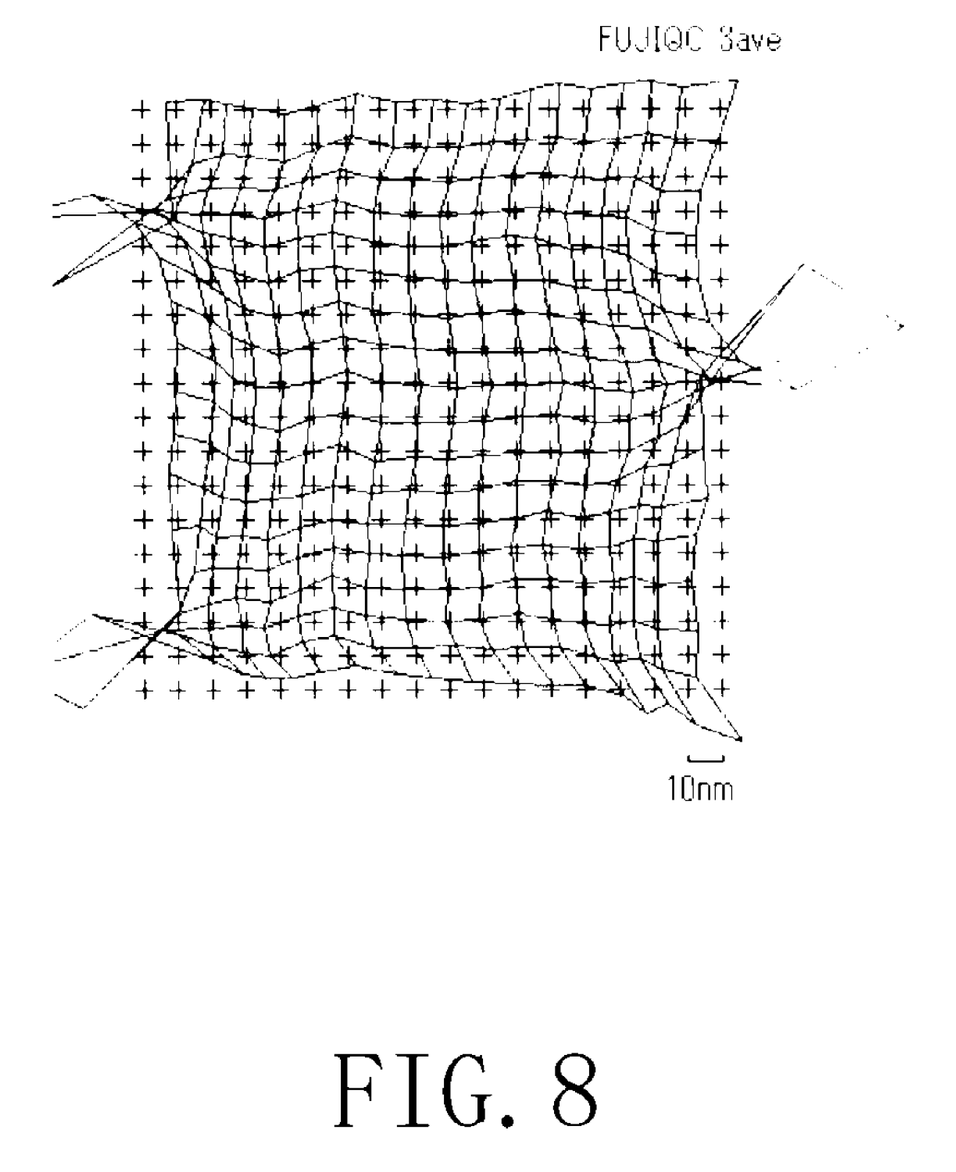
FIG. 8 is a diagram showing an average value of the maps of the three examples shown in FIGS. 6A to 6C.

FIG. 8 is a diagram showing the average value of the maps of the three examples shown in FIGS. 6A to 6C. As shown in FIG. 8, fluctuations in random position errors on grids of a mesh are suppressed by averaging, and a systematic position error common in the maps of the three examples is acquired. When the number of test patterns to be written, the fluctuation is required to be averaged, and a more systematic position error can be calculated as a matter of course.

Figure 9:
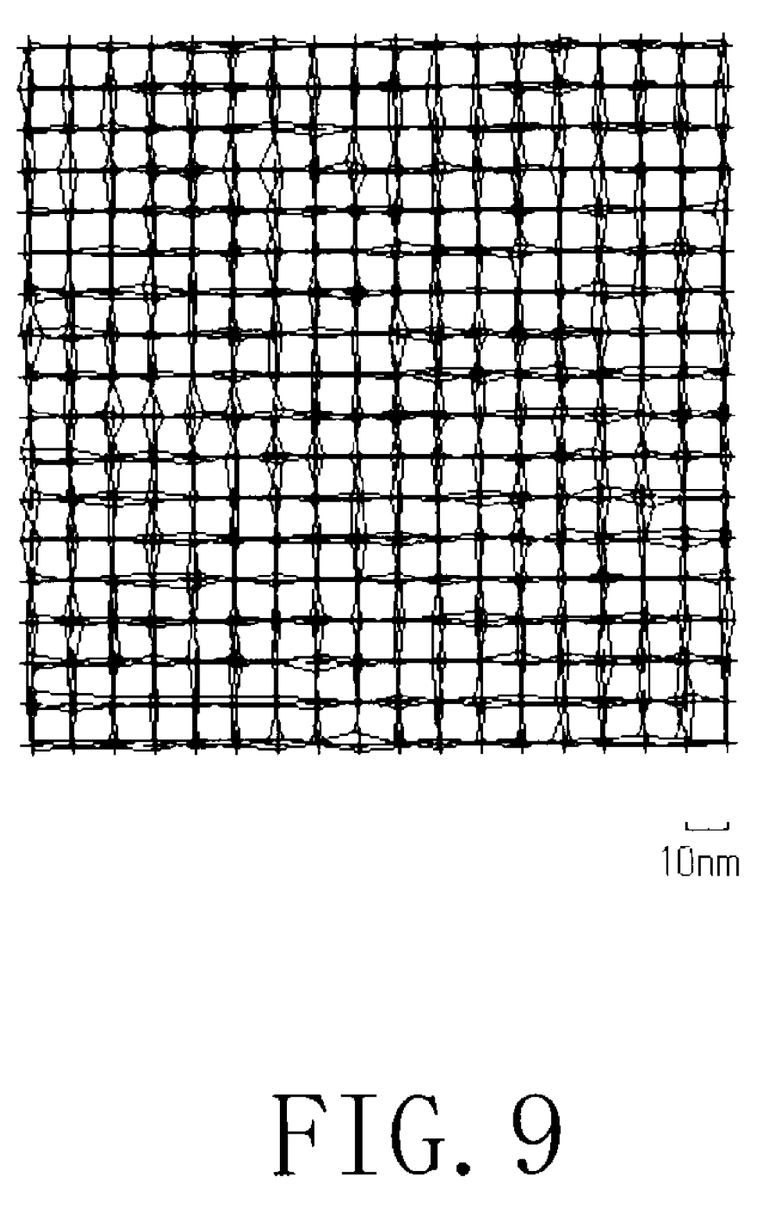
FIG. 9 is a diagram showing a result obtained by differentiating the averaging map shown in FIG. 8 from the maps of the three examples shown in FIGS. 6A to 6C.

FIG. 9 is a diagram showing the result obtained by differentiating the averaging map shown in FIG. 8 from the maps of the three examples shown in FIGS. 6A to 6C. FIG. 9 shows the results of the three examples that overlap. In the results shown in FIG. 9, the fluctuation is 2 nm to 3 nm, and the uncertainty of an amount of correction on each of the grids is reduced. As described above, when a plurality of conventional mask blanks are to be written, the uncertainty of the amount of correction is reduced by averaging.

In contrast to this, the case in which the correcting substrate 10 according to Embodiment 1 is scanned by the lithography apparatus 100 will be described below. When the error of a scanned irradiation position is, for example, about nm, for example, the correcting substrate 10 is preferably manufactured such that the error of the correcting substrate 10 itself is about 2 nm or less.

Figure 10A:
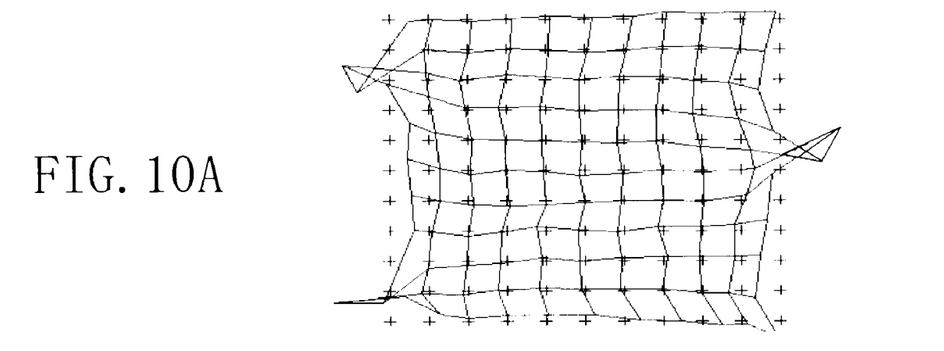
FIGS. 10A to 10C are diagrams showing examples of maps of position errors obtained when three correcting substrates 10 in Embodiment 1 are scanned respectively by a lithography apparatus 100.
Figure 10B:
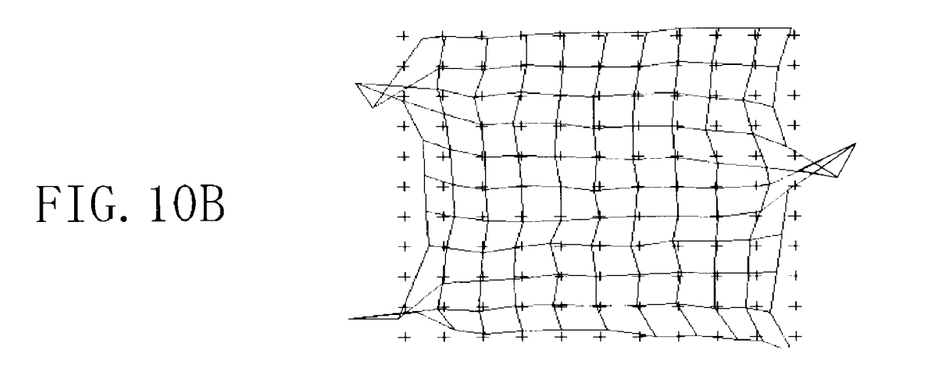
Figure 10C:
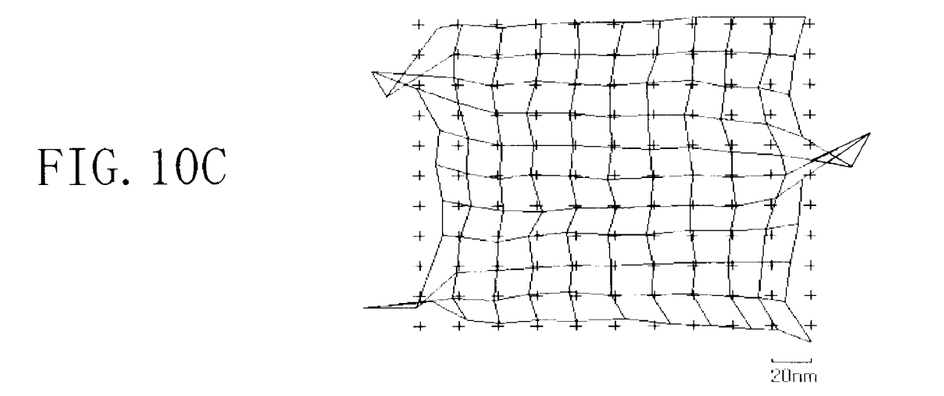

FIGS. 10A to 10C are diagrams showing examples of maps of position errors obtained when three correcting substrates in Embodiment 1 are scanned respectively by a lithography apparatus 100. In the three examples shown in FIGS. 10A to 10C, it also is understood that, for example, three positions occur at which errors locally increase as in the test patterns of the three examples shown in FIGS. 6A to 6C.

Figure 11A:
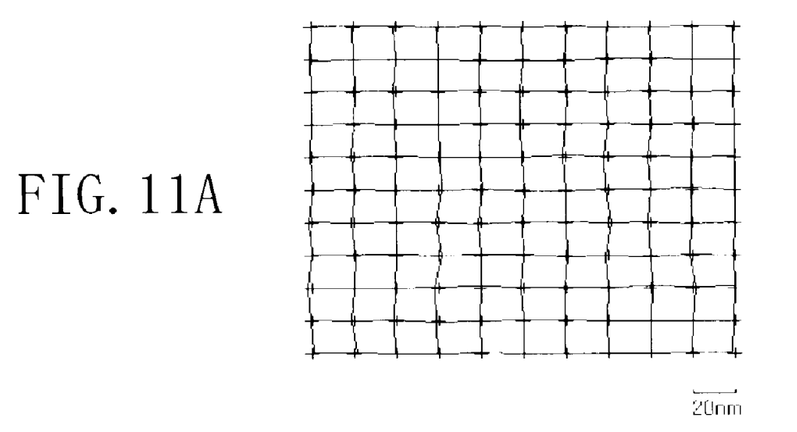
FIGS. 11A to 11C are diagrams showing maps obtained when two examples of the three examples shown in FIGS. 10A to 10C are differentiated from each other.
Figure 11B:
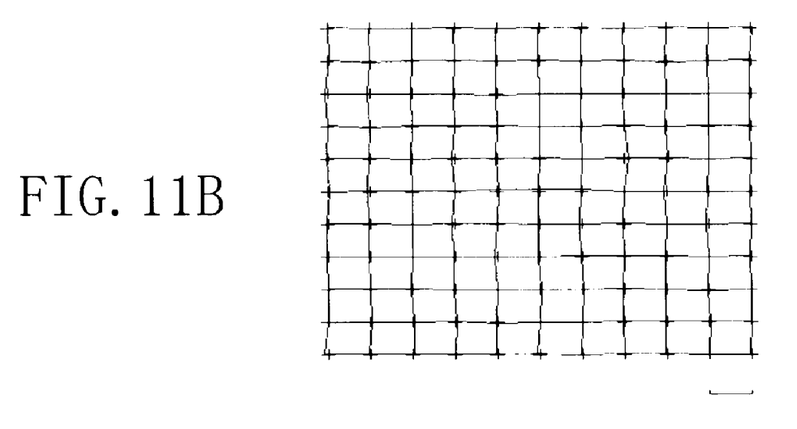
Figure 11C:
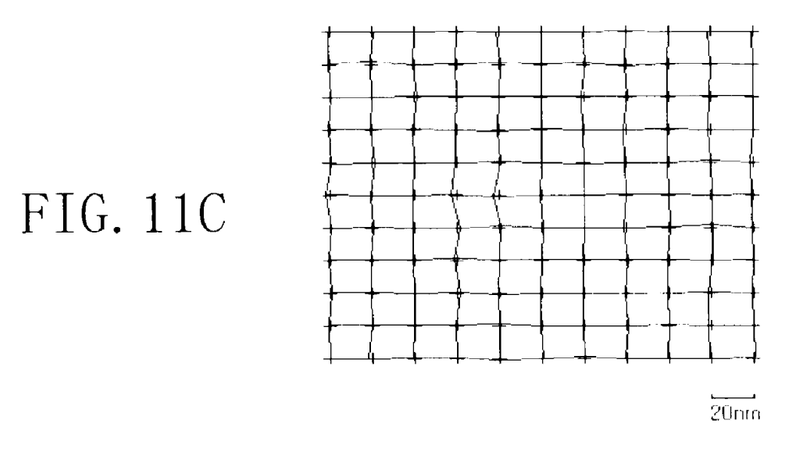

FIGS. 11A to 11C are diagrams showing maps obtained when two of the three examples shown in FIGS. 10A to 10C are differentiated from each other. FIG. 11A shows a map obtained by differentiating the error data shown in FIG. 10C from the error data shown in FIG. 10A. FIG. 11B shows a map obtained by differentiating the error data shown in FIG. 10A from the error data shown in FIG. 10B. FIG. 11C shows a map obtained by differentiating the error data shown in FIG. 10B from the error data shown in FIG. 10C. In each of the maps shown in FIGS. 11A to 11C, the above large local error is improved. Position correction in the lithography apparatus 100 is performed such that the amount of correction is set to reduce the large local error. Furthermore, in the maps shown in FIGS. 11A to 11C, fluctuations are 2 nm to 3 nm in advance, and averaging is not necessary as in a conventional art.

As described above, in the correcting substrate 10 according to Embodiment 1, the difference between reflectances is large, and a large contrast is sufficiently obtained. For this reason, an error can be accurately measured. Furthermore, in a conventional art, in order to improve accuracy, pattern writing is performed more than once by using a plurality of mask blanks as described above. However, in Embodiment 1, since the correcting substrate 10 itself has high accuracy, an error can be measured at sufficiently accuracy by performing measurement only once. More specifically, averaging of errors obtained by averaging results obtained by performing measurement more than once is not necessary. When an error (distortion) in the correcting substrate 10 itself is measured by another position measurer in advance, it can be said that the difference between an error of a result obtained by scanning the correcting substrate 10 with the lithography apparatus 100 and an error of the correcting substrate 10 itself is an unique distortion. When an error of a scanned irradiation position is, for example, about 5 nm, for example, the correcting substrate 10 is preferably manufactured such that the error of the correcting substrate 10 itself is about 2 nm or less. By using an accurate correcting substrate 10, a pattern may be written on a substrate, serving as a target object, on which a pattern is to be written as described below.

In activation of a lithography apparatus which performs pattern writing, by using the electron beam 200, the correcting substrate 10 on which two films having different reflectances are formed is scanned to detect reflected electrons reflected from the correcting substrate 10.

By using the detected result, an error of the irradiation position of the electron beam 200 is corrected. As the correcting method, the position error maps may be formed as described above. The position error $\Delta X_{ij}$ in the direction X and the position error $\Delta Y_{ij}$ in the direction Y at each of the positions on the substrate surface, as described above, for example, can be approximated by equations (1) and (2). The control calculator 130 sets the coefficients $A_0$ to $A_9$ and $B_0$ to $B_9$ obtained by calculation in the deflection control circuit 120. The deflection control circuit 120 may control the electron beam 200 to deflect the electron beam 200 to a position at which the position error $\Delta X_{ij}$ in the direction X and the position error $\Delta Y_{ij}$ in the direction Y which are calculated by equations (1) and (2) with respect to each of the coordinates of a pattern writing position when a pattern is written on a pattern writing target substrate.

As described above, in activation of a lithography apparatus which performs pattern writing, reflected electrons are detected and an error of irradiation position of the electron beam 200 are corrected.

By using the electron beam 200 the irradiation position of which is corrected, a pattern may be written on a pattern writing target substrate. In this manner, a plurality of mask blanks are used as a dummy substrate, and actual pattern writing is performed without correcting the error of the irradiation position of the electron beam 200 on the basis of pattern writing of the dummy substrate.

When pattern writing is performed by the pattern writing method described above, correction time in activation of an apparatus can be made considerably shorter than that required when an error of irradiation position is corrected by performing pattern writing by using a plurality of mask blanks as in a conventional art.

The embodiment is described with reference to the concrete examples. However, the present invention is not limited to the concrete examples.

Parts of the apparatus configuration, the control method, and the like which are not directly required for the explanation of the present invention are not described. However, the necessary apparatus configuration and the necessary control method are appropriately selected and used. For example, a concrete control unit configuration which controls the lithography apparatus 100 is not described. However, the necessary control unit configuration is appropriately selected and used as a matter of course.

In addition, all correcting substrates for a charged particle beam lithography apparatus which can be appropriately changed in design by a person skilled in the art are included in the spirit and scope of the invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A correcting substrate for correcting a stage position of a charged particle beam lithography apparatus which writes a pattern on a target object by using a charged particle beam, comprising:
    a substrate body using a low thermal expansion material having a thermal expansion lower than that of a silicon oxide ($SiO_2$) material;
    a first conductive film arranged above the substrate; and
    a second conductive film selectively arranged directly on the first conductive film and having a reflectance higher than the first conductive film, wherein
    the low thermal expansion material is exposed on a rear surface of the correcting substrate.

2. The correcting substrate according to claim 1, wherein the first conductive film contains at least one of chromium (Cr), titanium (Ti), and vanadium (V).

3. The correcting substrate according to claim 1, wherein the second conductive film contains at least one of tantalum (Ta), tungsten (W), and platinum (Pt).

4. The correcting substrate according to claim 1, wherein a plurality of openings which are regularly arranged and penetrate to the first conductive film are formed in the second conductive film.

5. The correcting substrate according to claim 1, wherein the reflectance is a reflectance of an electron beam.

6. The correcting substrate according to claim 1, wherein as a material of the second conductive film, an atom having an atomic number larger than that of an atom of the first conductive film is used.

7. The correcting substrate according to claim 1, wherein titanium (Ti) is doped in the substrate body.

8. The correcting substrate according to claim 1, wherein chromium (Cr) is used as a material of the first conductive film, and tantalum (Ta) is used as a material of the second conductive film.

* * * * *